(12) United States Patent
Qawami et al.

(10) Patent No.: US 7,802,061 B2
(45) Date of Patent: Sep. 21, 2010

(54) COMMAND-BASED CONTROL OF NAND FLASH MEMORY

(75) Inventors: Shekoufeh Qawami, El Dorado Hills, CA (US); Rodney R. Rozman, Placerville, CA (US); Sean S. Eilert, Penryn, CA (US)

(73) Assignee: Intel Corporation, Santa Clara, CA (US)

(*) Notice: Subject to any disclaimer, the term of this patent is extended or adjusted under 35 U.S.C. 154(b) by 557 days.

(21) Appl. No.: 11/644,464

(22) Filed: Dec. 21, 2006

(65) Prior Publication Data

US 2008/0151622 A1    Jun. 26, 2008

(51) Int. Cl.
*G06F 12/00* (2006.01)
(52) U.S. Cl. .................. 711/154; 711/103; 711/167; 711/E12.001
(58) Field of Classification Search ................ 711/103, 711/154, 167, E12.001
See application file for complete search history.

(56) References Cited

U.S. PATENT DOCUMENTS

| | | | | |
|---|---|---|---|---|
| 5,023,829 | A * | 6/1991 | Shibata | 710/33 |
| 5,410,680 | A | 4/1995 | Challa et al. | |
| 5,822,251 | A * | 10/1998 | Bruce et al. | 711/E12.008 |
| 5,835,965 | A | 11/1998 | Taylor et al. | |
| 6,282,603 | B1 | 8/2001 | Rao | |
| 6,442,644 | B1 * | 8/2002 | Gustavson et al. | 711/105 |
| 2001/0007533 | A1 * | 7/2001 | Kobayashi et al. | 365/185.11 |
| 2002/0002653 | A1 | 1/2002 | Lakhani et al. | |
| 2003/0014688 | A1 * | 1/2003 | Wu | 714/7 |
| 2003/0123319 | A1 * | 7/2003 | Kim | 365/233 |
| 2005/0204091 | A1 * | 9/2005 | Kilbuck et al. | 711/103 |
| 2006/0129701 | A1 | 6/2006 | Qawami et al. | |
| 2007/0233988 | A1 * | 10/2007 | Adusumilli | 711/166 |

FOREIGN PATENT DOCUMENTS

WO   WO-2008079788   7/2008

OTHER PUBLICATIONS

"PCT International Preliminary Report on Patentability (Chapter I of the Patent Cooperation Treaty) for Application No. PCT/US2007/087811", (Jul. 2, 2009), Whole Document.
"PCT International Search Report and Written Opinion of the International Searching Authority for Application No. PCT/US2007/087811", (May 26, 2008), Whole Document.

* cited by examiner

*Primary Examiner*—Sheng-Jen Tsai
*Assistant Examiner*—Michael C Krofcheck
(74) *Attorney, Agent, or Firm*—Blakely, Sokoloff, Taylor & Zafman LLP

(57) ABSTRACT

Some embodiments of the invention use a command-based interface to control reads and writes with non-volatile memory devices. This may reduce the number of pins that are needed on each integrated circuit, and therefore reduce the cost and size of those integrated circuits. In some embodiments, an on-die cache buffer may be used to buffer data transfers between a high-speed memory bus and the slower speed non-volatile array.

4 Claims, 7 Drawing Sheets

COMMAND FORMAT

COMMAND FORMAT

COMMAND-BASED CONTROL OF NAND FLASH MEMORY

BACKGROUND

By industry convention, flash memory devices are typically categorized as NAND or NOR flash memory, based on the underlying circuit technology used in the memory arrays. Due to the inherent characteristics of each, NOR flash is typically used for truly random access applications in which single addresses are frequently read/written (e.g., as with instruction code), while NAND is typically used for block-oriented applications in which entire blocks of data are read or written together (e.g., as with digitized graphics images). Conventional NAND flash memory uses an asynchronous control interface that relies on a number of control signals for reading and writing data. For example, separate control signals such as Address Latch Enable (ALE), Command Latch Enable (CLE), and Read Enable (RE) may each be implemented on separate pins to trigger the associated functions. However, as pressure increases to reduce both the cost and size of the NAND flash chips, the cost of installing those additional pins, and the size limits imposed by them, become factors that limit increased use of NAND flash.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

Figure 1:
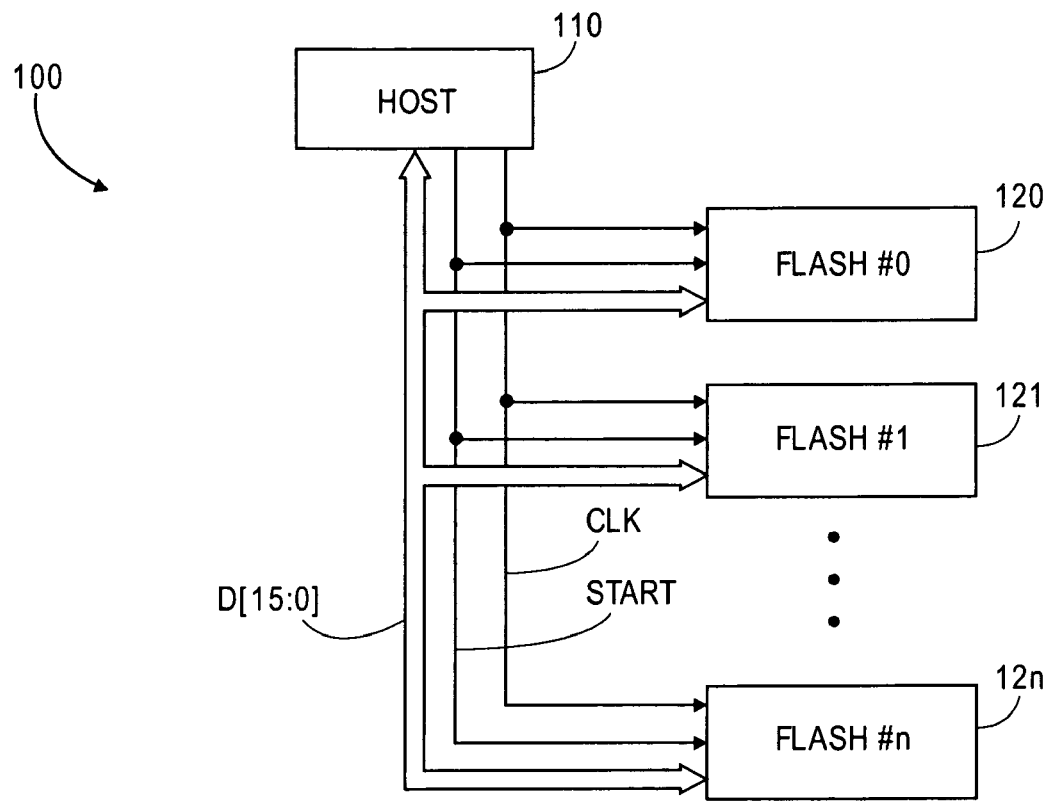
FIG. 1 shows a diagram of a system containing non-volatile memory devices controlled by a host device, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a machine-readable medium, which may be read and executed by one or more processors to enable performance of the operations described herein. A machine-readable medium may include any mechanism for storing, transmitting, and/or receiving information in a form readable by a machine (e.g., a computer). For example, a machine-readable medium may include a storage medium, such as but not limited to read only memory (ROM); random access memory (RAM); magnetic disk storage media; optical storage media; a flash memory device, etc. A machine-readable medium may also include a propagated signal which has been modulated to encode the instructions, such as but not limited to electromagnetic, optical, or acoustical carrier wave signals.

Some embodiments of the invention may use a command-based interface in NAND flash memory integrated circuits to reduce the number of pins required on the integrated circuits. For example, some embodiments may need no more than the power supply pins, a clock pin, and the input/output (I/O) pins. Other embodiments may also use a reset or start pin to assure the chip does not lose synchronization with the command/address/data sequences. Because the functions to be performed by the memory device are expressed as commands, there is no need for separate pins to carry such signals as Read/Write, Address Enable, Data Enable, etc. Some embodiments may automatically return to a receive mode of operation following the command/address/data sequence, without requiring a specific command or signal to force them into the receive mode.

FIG. 1 shows a diagram of a system containing non-volatile memory devices controlled by a host device, according to an embodiment of the invention. Although the drawing is labeled for flash devices, in some embodiments the memory devices 120-12n may be based on other types of non-volatile memory technology. In some embodiments, the devices are NAND flash memory devices. In some embodiments, each memory device 120-12n is contained in a separate integrated circuit, but other embodiments may combine multiple logical memory devices into a single integrated circuit and/or a single package. Each indicated signal line may connect to the indicated memory device through a separate pin.

Each memory device 120-12n may be controlled by a host device 110, which in the illustrated embodiment controls the memory devices over a bus containing a set of input/output (I/O) lines D[15:0], a clock line CLK, and a start line START. Although specific labels are used here to describe the various lines and their functions, these are for convenience only and other embodiments may use any convenient set of labels. Sixteen I/O lines are indicated by D[15:0] in the drawing, but other embodiments may contain other quantities of I/O lines (e.g., 8, 32, 64, etc.). In some embodiments, the bus may contain no other signal lines. Power lines to provide operating power to the memory devices are not shown, and may take any feasible form. During operation, the host device may select, and communicate with, any of the memory devices 120-12n over the bus, using no more signal lines than those shown. In some embodiments, each device shown in FIG. 1 (i.e., the host device 110 and each memory device 12x) may reside in a separate integrated circuit.

In the illustrated embodiment, the host device 110 may transfer data to or from one or more of the memory devices by first sending a command over the I/O lines that both selects the memory device(s), and also contains an indication of what the selected memory device is to do. In some embodiments a signal on the START line may be used to indicate that the signals on the I/O lines represent a command. The host device may then send an address on the same set of I/O lines to indicate a starting address within the memory device that the memory device is to access while performing the indicated command. This may be followed by the data that is being transferred over the same set of I/O lines, starting at the previously indicated address.

In some embodiments, the host device may also initiate data transfer sequences that do not involve memory addresses. For instance, the host device may issue a command that the selected memory device is to return status information to the host device. In such a case, no memory address need be sent, and the selected memory device might follow the command by placing its requested status on the I/O lines for reading by the host device. Similarly, the host device might issue a command that configuration data is to be written into the memory device, in which case the host device might follow the command by placing the configuration data on the I/O lines, for reading and implementation by the selected memory device. Still other commands may not involve data transfer at all. For example, in some embodiments an Erase command may be issued to the selected memory device without the need for any data transfer. In other embodiments, a small amount of data may be transmitted to the memory device to specify which block(s) to erase.

Figure 2:
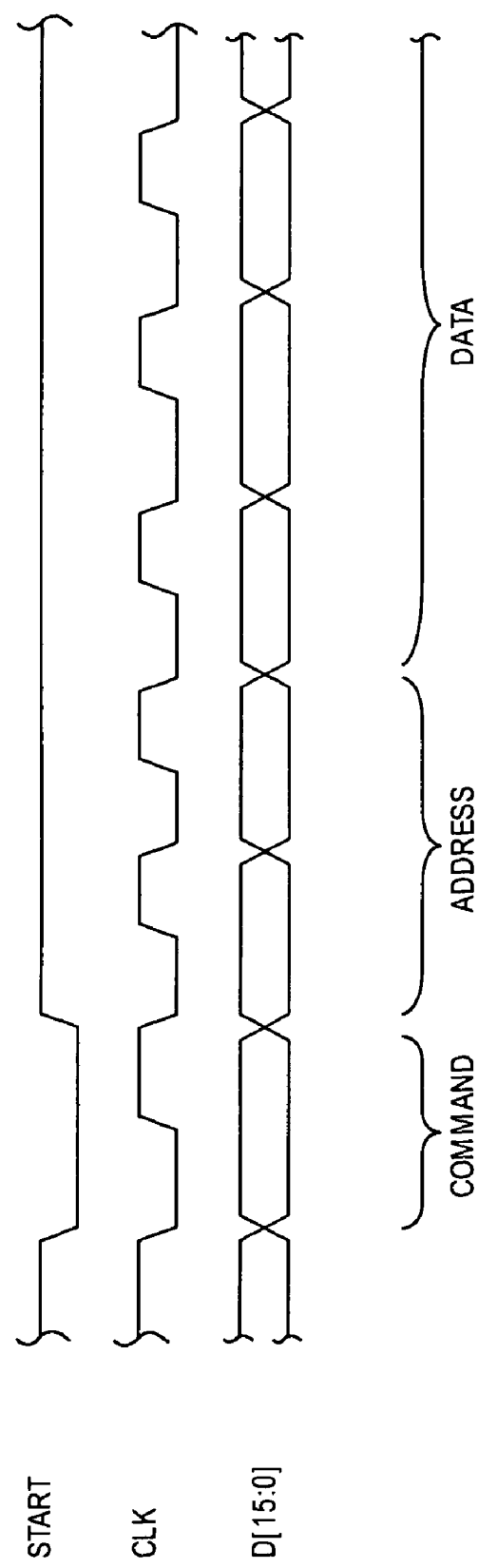
FIG. 2 shows a timing diagram of a communications sequence between a host device and a non-volatile memory device, according to an embodiment of the invention.

FIG. 2 shows a timing diagram of a communications sequence between a host device and a non-volatile memory device, according to an embodiment of the invention. In the illustrated embodiment, each clock cycle is used to latch the signals on the I/O lines. In the embodiment shown, a clock transition in one direction (in this case low-to-high) may latch the data, while a clock transition in the opposite direction may coincide approximately with the signal level changes on the I/O lines. Other embodiments may use other clock timing schemes (for example, a double data rate embodiment might use clock transitions in both directions to latch data, while the signals on the I/O lines would change between clock transitions). Any polarity may be used for any of the signal lines, depending on the convention chosen for the bus design.

The first set of signals on the I/O lines may represent a command. The illustrated embodiment implements a command in a single clock cycle, implying for this example that all versions of a command may be contained within the 16 available I/O lines. Other embodiments may use multiple clock cycles to transfer the command (e.g., if the available lines are not enough to fully define the command). In some embodiments the number of clock cycles in a command may be fixed, but in other embodiments the first part of the command itself may contain an indication of how many clock cycles are to be used to transfer the entire command. The command may contain various types of information, depending on the requirement designed into the system.

The command portion of the transaction may be followed by an address portion that indicates a starting address in the selected memory device where a data transfer should begin. In some embodiments the address may specify a location down to a specific byte or word, but other embodiments may use other levels of granularity in the address. For example, by assuming the lowest significant bits of the byte-level address are set to zero, and by not including those bits in the address portion, the address portion may locate a particular page or other large block of data, with the starting address of that block being the designated starting point for a data transfer. The illustrated example shows two clock cycles devoted to the address portion (a total of 32 bits with a 16-bit data bus), but depending on the maximum allowable address range and the address granularity, one, three, or more clock cycles may be used for the address portion.

Following the address portion, the remainder of the sequence may be devoted to the actual data to be transferred. In some embodiments the length of the sequence (or of some portion of the sequence, such as the data portion) may be fixed. In other embodiments, the length may be variable, and a portion of the command may specify that length.

Since the same I/O lines are used for command, address, and data, the memory devices need some way of distinguishing between them. As long as the memory devices are able to determine when a command is on the I/O lines, the rest of the sequence may be determined either by following a predetermined fixed format, or by using information in the command to determine how many of the subsequent clock cycles are devoted to the address and data portions. In the illustrated example, a Start signal is used to indicate the starting clock cycle of the sequence (i.e., the command portion).

Figure 3:
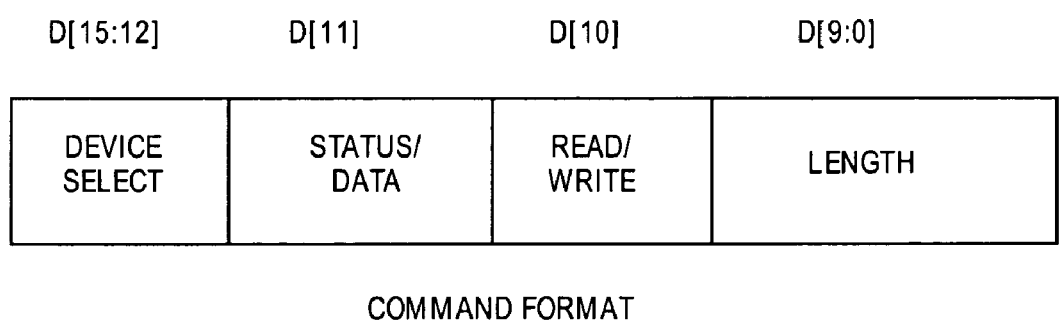
FIG. 3 shows the format of a command, according to an embodiment of the invention.

FIG. 3 shows the format of a command, according to an embodiment of the invention. For purposes of illustration, a sixteen-bit command format is shown, with specific fields having specific widths and occupying specific I/O lines, but other embodiments may use other formats. In the illustrated embodiment, the most significant four bits are used as a Device Select field to select a particular memory device from among the memory devices on the bus. Four bits will allow up to 16 devices to be on the bus. The illustrated Status/Data field is used to determine whether the operation is to be a data transfer operation, or a status transfer operation. The Read/Write field is used to determine whether information is to be read by the host device from the memory device, or written to the memory device from the host device.

If the Status/Data field indicates Status and the Read/Write field indicates read, then the selected memory device may place its status on the I/O lines in a subsequent clock cycle (e.g., the cycle immediately following the command, although other embodiments may use other techniques) for reading by the host device. If the Status/Data field indicates Status and the Read/Write field indicates Write, then the host device may place configuration data on the I/O lines in a subsequent clock cycle, which the selected memory device may use to set its configuration. If the Status/Data field indicates Data, then the Read/Write field may be used to determine whether data is to be written from the host device into the selected memory device, or data is to be read from the memory device by the host device.

The Length field may be used to indicate the length of the transaction that is being initiated by the command. This field may be interpreted in various ways, depending on the design of the system. For example, the quantity in the Length field may indicate any of the following, or may indicate any feasible length parameter not listed here: 1) the length of the entire transaction with the selected memory device, 2) the length of the remaining portions of the transaction, 3) the length of a specific portion of the transaction, such as the address portion or the data portion, 4) etc. The value in the length portion may indicate any feasible unit of measure, such as clock cycles, bytes, words, double-words, quad-words, etc. In some embodiments, if no length indicator is needed (e.g., because the command indicates a status operation, or because all data transfers have a fixed length), this field may be used for other purposes or may be ignored.

Figure 4:
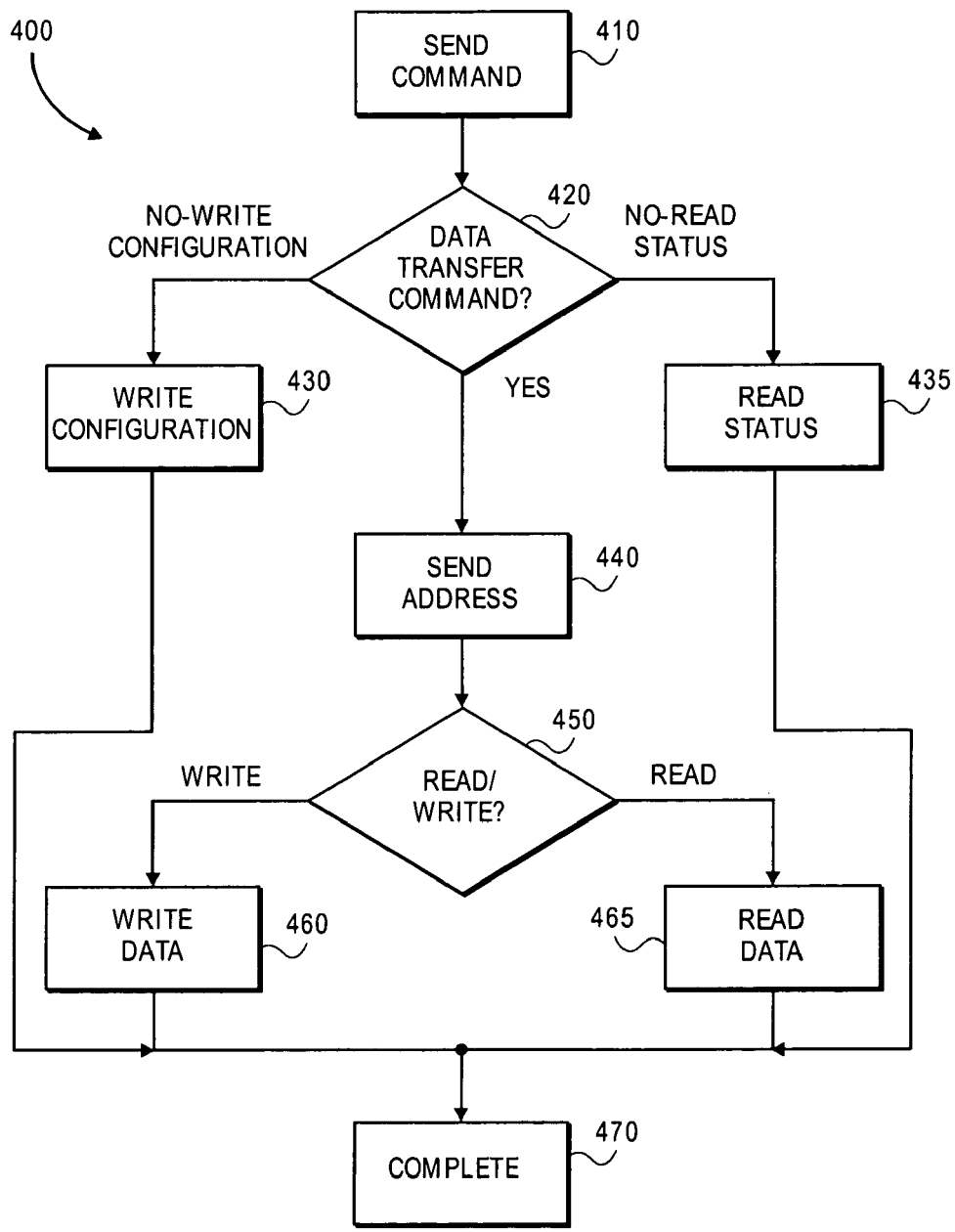
FIG. 4 shows a flow diagram of a method of performing a communications sequence in a host device, according to an embodiment of the invention.

FIG. 4 shows a flow diagram of a method of performing a communications sequence in a host device, according to an embodiment of the invention. In flow diagram 400, a host device sends a command over a set of I/O lines to a memory device at 410. If the command was a 'Read Status' command, the host device may then read the status of the selected memory device at 435 over the same set of I/O lines that were used to send the command. If the command was a 'Write Configuration' command, the host device may then write the configuration information to the selected memory device at 430 on the same set of I/O lines that were used to send the command. If the command was a 'Transfer Data' command, as determined at 420, then the host device may send an address to the selected memory device at 440 by placing the address on the same I/O lines that were used to send the command. This may give the selected memory device a starting address within its own memory array at which the data transfer is to start.

If the data transfer is a Read, as determined at 450, the selected memory device may retrieve data from its own memory array, starting at the specified memory address, and place the data on the I/O lines. The host device may begin reading that data over the I/O lines at 465. This process of the memory device placing data on the I/O lines and the host device reading the data from the I/O lines may be repeated as many times as necessary to complete the data transfer. In some embodiments, the command may have specified the length of the transfer.

In a similar manner, if the data transfer is a Write, as determined at 450, the host device may begin placing the data on the I/O lines 460, from where the selected memory device may retrieve the data and write the data into its own memory array, starting at the previously specified address. Once all the data or status information or configuration information has been transferred, the process is complete at 470. With both Read and Write operations, in some embodiments the data may be buffered between the memory array and the I/O lines.

Figure 5:
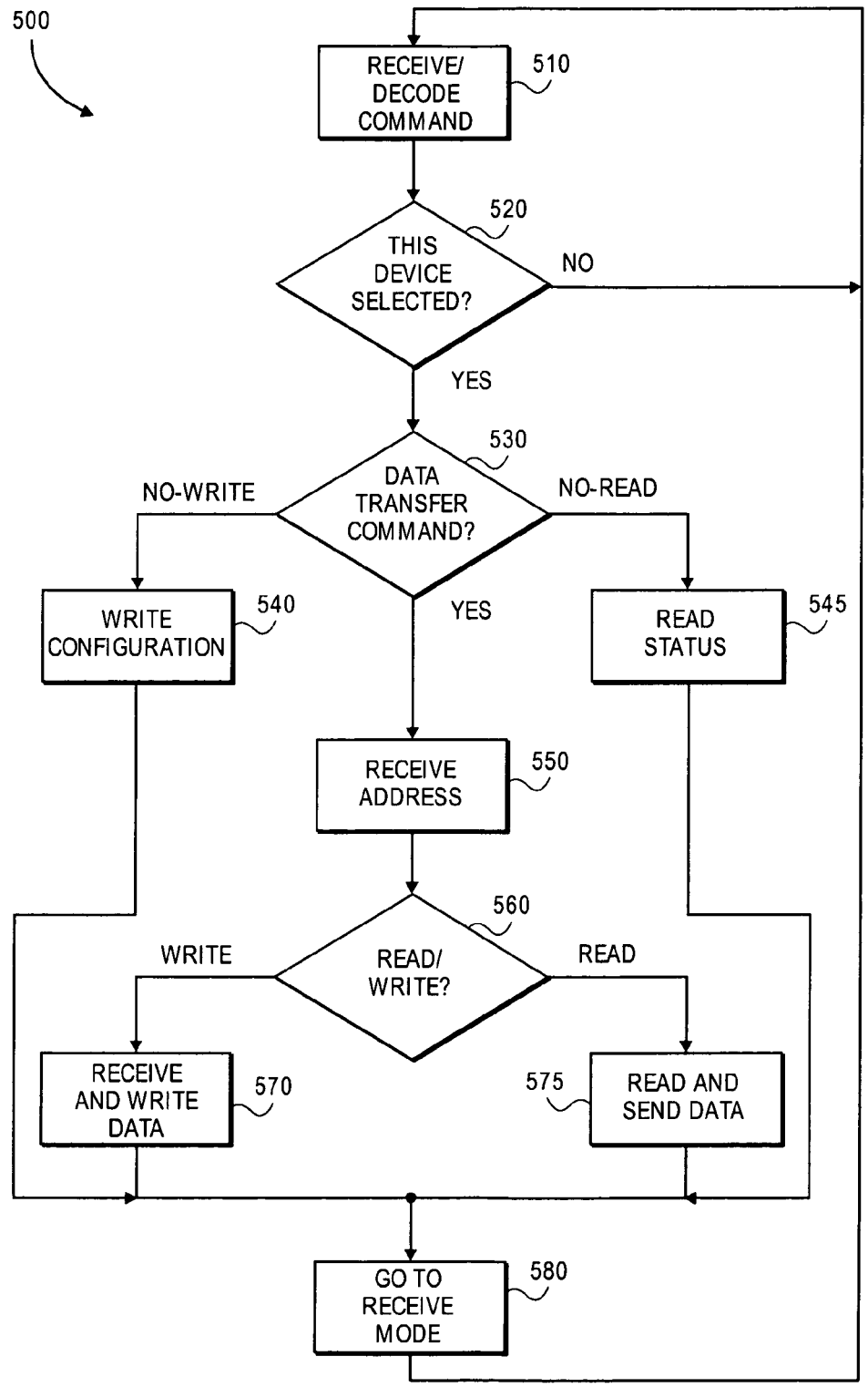
FIG. 5 shows a flow diagram of a method of performing a communications sequence in a memory device, according to an embodiment of the invention.

FIG. 5 shows a flow diagram of a method of performing a communications sequence in a memory device, according to an embodiment of the invention. In flow diagram 500, at 510 a memory device may receive a command over a set of I/O lines and decode the command. In some embodiments, the first signals received over the I/O lines after a predetermined event may be considered a command. In other embodiments, another signal (e.g., the Start signal shown in FIG. 2) may be sent at the same time as (or in some embodiments immediately prior to) the command to indicate that the signals on the I/O lines should be interpreted by the memory device as a command. The command may then be decoded to determine what the memory device is to do.

A portion of the command may be devoted to a selection identifier to indicate which memory device on the bus the command is directed to. All other devices on the bus may ignore the command. At 520, the selected memory device may further decode the command at 530 to determine if the command is a data transfer command. Within the context of this document, a data transfer command is a command that indicates data is to be transferred between the host device and the memory array of the memory device. Commands that are not data transfer commands may be used to transfer information between the host device and the control circuitry in the memory device, without involving the memory array. Additionally, the command may be decoded to determine if the command involves a write (the relevant subsequent data goes from the host device to the memory device) or a read (the relevant subsequent data goes from the memory device to the host device). Although decoding the device selection, data transfer, and read/write portions of the command are described separately, in some embodiments some or all of these may be decoded at the same time.

If the command is not a data transfer command and a read is indicated, the selected memory device may place its status on the I/O lines at 545 so the host device can read that status. If the command is not a data transfer command and a write is indicated, the host device may place configuration data on the I/O lines, and the selected memory device may use that information to set its configuration at 540. In either case, when the command sequence is finished, the memory device may place itself in a receive mode at 580 so it is ready to receive and decode further commands.

If the command is a data transfer command as determined at 530, indicating the data is to be written into or read from the memory array of the selected memory device, the selected memory device may then read an address at 550 that the host device has placed on the I/O lines subsequent to the command. The address may indicate the address in the memory array at which a data transfer is to begin. In some embodiments, the address will be on the I/O lines one clock cycle after the command was on the I/O lines. If the address requires more bits than can be simultaneously expressed on the I/O lines, more than one clock cycle may be devoted to transferring the address over the I/O lines.

If the data transfer is to be a read operation, as indicated at 560, then at 575 the memory device may begin reading data from its array and placing that data on the I/O lines for the host device to read. The number of clock cycles devoted to transferring this data may depend on the amount of data to be transferred. In some embodiments the number of clock cycles for this transfer may have been indicated by the command, but in other embodiments the number may be predetermined. After the data has been transferred, the communications sequence may be over, and the memory device may place itself in receive mode at 580 to await further commands.

If the data transfer is to be a write operation, as indicated at 560, the memory device may get data from the I/O lines and write that data into the memory device's memory array at 570. As before, the length of the transfer may be fixed in some embodiments, or may be indicated in the command in other embodiments. When the data transfer is complete, the memory device may put itself into a receive mode at 580 to await further commands.

Figure 6:
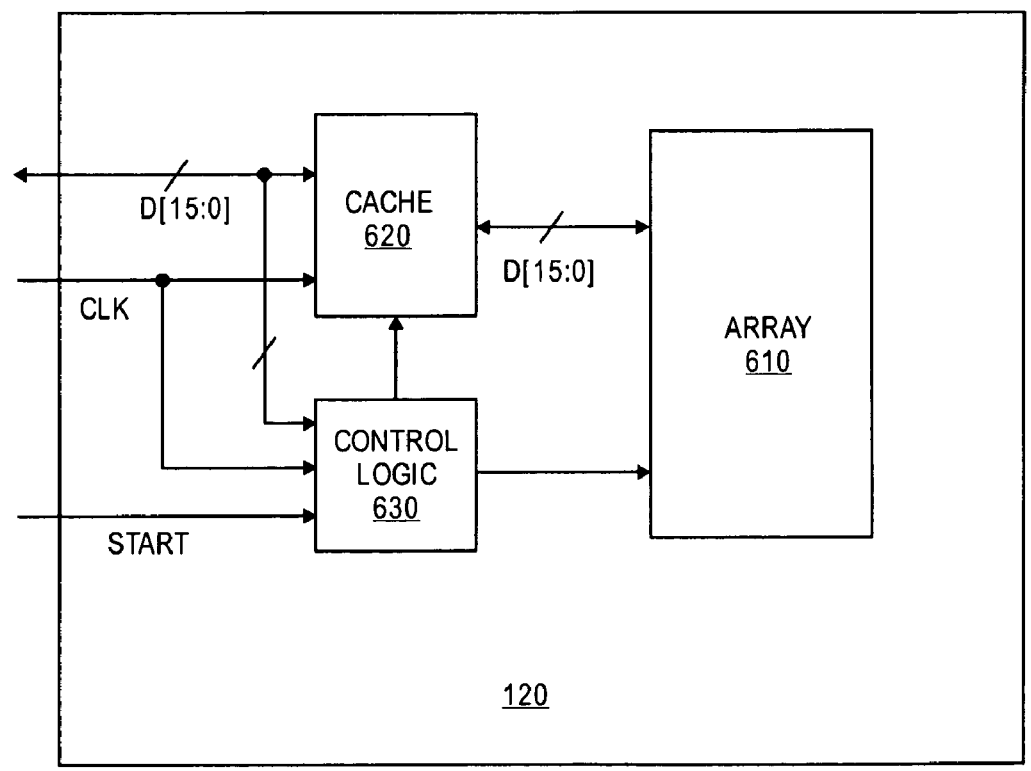
FIG. 6 shows a block diagram of a non-volatile memory device, according to an embodiment of the invention.

FIG. 6 shows a block diagram of a non-volatile memory device, according to an embodiment of the invention. For convenience of illustration only, the memory device 120 of FIG. 1 is the example shown in FIG. 6, but other embodiments may use other memory devices, whether or not they have been specifically described in this document. Memory device 120 may include a storage array 610 of non-volatile memory cells. In some embodiments the cells may be flash memory cells. In some particular embodiments, the cells may be NAND flash memory cells. The array may have the cells arranged in any convenient word size and address range. A cache buffer 620 may be used to buffer data that is being read from, or written to, the array 610 from a memory controller (e.g., from host device 110 in FIG. 1). The cache buffer 620 may be implemented in any feasible form, such as but not limited to: 1) a volatile memory array, 2) a first-in first-out buffer (FIFO), 3) etc. Control logic 630 may control operations within the memory device 120, based at least partly on commands received from the memory controller. As previously described, the commands and the data may be transferred over the same lines D[15:0] of the memory bus at different times during a command sequence, a START signal may be used to initiate the command sequence, and a CLK signal may be used to synchronously transfer the data, commands, etc.

Figure 7:
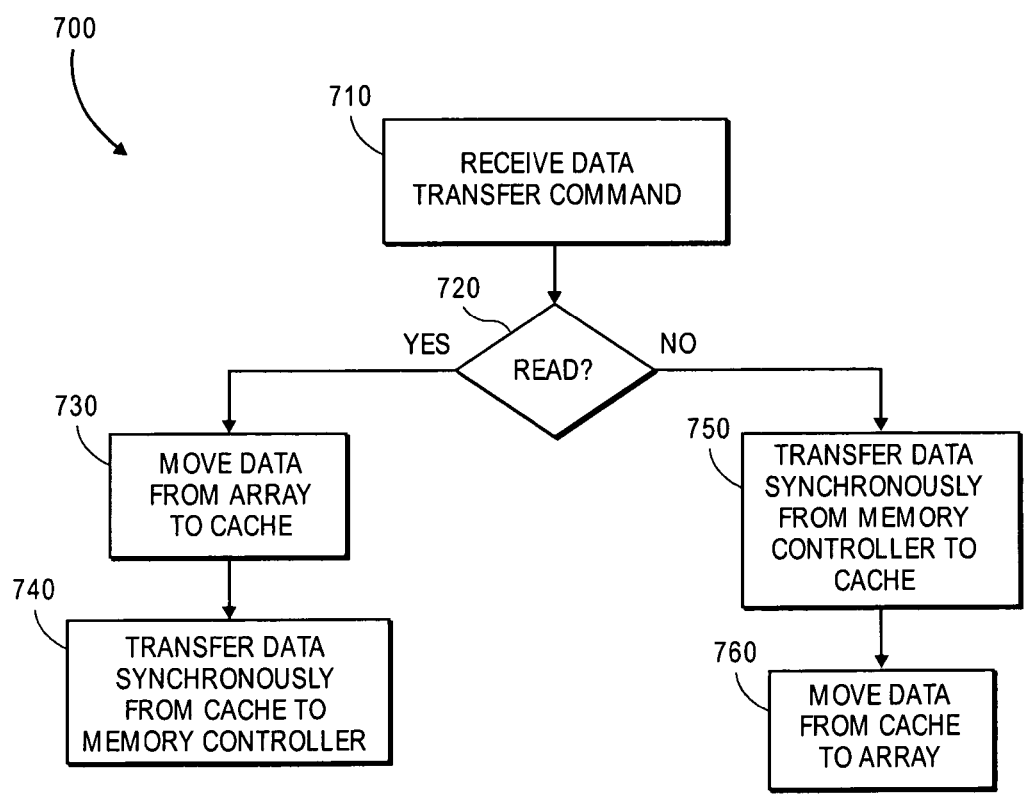
FIG. 7 shows a flow diagram of a method of operating a memory device, according to an embodiment of the invention.

FIG. 7 shows a flow diagram of a method of operating a memory device, according to an embodiment of the invention. In flow diagram 700, at 710 the memory device may receive a command from a memory controller to transfer data into or out of its storage array. In some operations, it may also receive an address within the array from which to start the data transfer. If the command is a Read command, as determined at 720, then at 730 the memory device may transfer data from the designated portion of its storage array into its cache buffer. At 740, this data may be synchronously transferred from the cache to the requesting memory controller over a memory bus, using a clock signal on the bus for timing. Similarly, if the command is a Write command, as determined at 720, then at 750 data may be synchronously transferred from a memory controller over a memory bus into the cache buffer of the memory device, again using a clock signal on the bus for timing. The data may then be transferred from the cache buffer to the array at 760.

The preceding description assumes that the command indicated that data should be read from or written into the storage array. Other commands may involve reading data from, or writing data to, the memory device without involving the storage array or the cache buffer. For example, a 'read status' command may be issued to the memory device, requesting the memory device to read some type of status information from one or more registers in its control logic, and place that status information onto the memory bus for the memory controller to read. Similarly, a 'write configuration' command may be issued to the memory device, requesting the memory device to take configuration information from the memory bus and write that information into internal registers in the memory device's control logic.

A cache buffer within the memory device may be used to great advantage when the data transfer rate over the memory bus is much faster than the data transfer rate of the storage array. The memory controller may issue a command that triggers the memory device to begin reading data from its storage array and placing that data in the associated storage buffer. The memory controller may then perform other operations with other memory devices while waiting for this slow internal operation to complete. Once the designated amount of data (e.g., a page of data) has been placed in the cache buffer, the memory controller may perform a high-speed operation over the memory bus to transfer the data from the cache buffer to the memory controller. Operations in the reverse direction may be similar, with a high-speed transfer of data from the memory controller to the cache memory of the designated memory device. The memory device may then transfer the data from its cache buffer to its storage array at a slower rate, leaving the memory controller free to perform other operations with other memory devices.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. A method, comprising:
   receiving a command for operation of a non-volatile memory device on a set of input/output lines, the command indicating a read operation or a write operation;
   receiving an address on the set of input/output lines subsequent to receiving the command, the address indicating a starting location of a data transfer operation; and
   receiving data on the set of input/output lines subsequent to receiving the address, the data to be transferred to or from a block of addresses in the non-volatile memory device starting with the received address;
   wherein:
      a single clock signal is used to latch the address and data;
      said receiving the command comprises interpreting signals on the input/output lines as a command for a first number of clock cycles;
      said receiving the address comprises interpreting signals on the input/output lines as an address for a second number of clock cycles; and
      said receiving the data comprises interpreting signals on the input/output lines as data for a third number of clock cycles;
      the third number of clock cycles is indicated in the command.

2. The method of claim 1, wherein another signal is used to latch the command.

3. The method of claim 1, wherein said receiving a command comprises receiving a command for operation of a NAND flash memory device.

4. The method of claim 1, further comprising automatically returning to a receive mode of operation subsequent to said receiving the data.

* * * * *